US005702991A

United States Patent [19]

Jacobs

[11] Patent Number: 5,702,991
[45] Date of Patent: Dec. 30, 1997

[54] INTERPENETRATING NETWORK COMPOSITIONS AND STRUCTURES

[76] Inventor: Richard L. Jacobs, 3831 San Felipe Ave., Newbury Park, Calif. 91230

[21] Appl. No.: 661,338

[22] Filed: Jun. 12, 1996

Related U.S. Application Data

[63] Continuation of Ser. No. 389,432, Feb. 14, 1995, abandoned, which is a continuation of Ser. No. 824,583, Jan. 23, 1992, abandoned.

[51] Int. Cl.$^6$ .................. C08J 5/08; C08J 5/24; C08F 2/50
[52] U.S. Cl. .................. 442/72; 442/74; 442/149; 442/180; 522/63; 522/66; 522/81; 522/83; 522/167; 522/179; 522/181; 522/182; 522/184; 522/186
[58] Field of Search .................. 428/245, 255, 428/260, 289, 290; 522/142, 29, 66, 26, 63, 81, 83, 167, 179, 181, 182, 184, 186; 442/72, 74, 149, 180

[56] References Cited

U.S. PATENT DOCUMENTS

| | | | |
|---|---|---|---|
| 4,128,600 | 12/1978 | Skinner et al. | 522/182 |
| 4,170,664 | 10/1979 | Spenadel et al. | 522/71 |
| 4,369,223 | 1/1983 | Phillips | 522/83 |
| 4,425,287 | 1/1984 | Heses et al. | 522/83 |
| 4,439,291 | 3/1984 | Irving et al. | 522/100 |
| 4,479,983 | 10/1984 | Appelt et al. | 522/79 |
| 4,512,340 | 4/1985 | Buck | 522/79 |
| 4,551,415 | 11/1985 | Cohen et al. | 522/79 |
| 4,857,579 | 8/1989 | Domeier | 524/507 |
| 5,013,768 | 5/1991 | Kiriyama et al. | 522/81 |
| 5,110,867 | 5/1992 | Schutyser et al. | 525/903 |
| 5,192,642 | 3/1993 | Steiner et al. | 522/29 |
| 5,222,987 | 6/1993 | Jones | 428/290 |
| 5,229,253 | 7/1993 | Zertani et al. | 522/29 |
| 5,330,820 | 7/1994 | Li et al. | 428/113 |
| 5,354,585 | 10/1994 | Shibata et al. | 428/35.9 |

*Primary Examiner*—Susan W. Berman
*Attorney, Agent, or Firm*—Louis J. Bachand

[57] ABSTRACT

Structure, composition and method in which a fiber reinforcement is impregnated with an interpenetrating network of a light cure resin and a thermosetting resin which are independently curable, enabling autobody component repair, electronic assembly bonding, etc. by selective cure first of one or the other resin, and the support against fluid flow of the uncured resin by the first cured resin.

17 Claims, No Drawings

INTERPENETRATING NETWORK COMPOSITIONS AND STRUCTURES

REFERENCE TO RELATED APPLICATION

This application is a continuation of application Ser. No. 08/389,432 filed on Feb. 14, 1995, now abandoned, which is a continuation of my application Ser. No. 07/824,583 filed Jan. 23, 1992, now abandoned.

FIELD OF THE INVENTION

This invention has to do with improved products and methods for autobody component repair, improved products and methods for electronic assembly, and other applications, more generally with novel compositions and novel structures comprising an interpenetrating network of separately curable resins which afford the opportunity to first cure one resin and thereby to maintain the other resin in place for subsequent cure to the final product. In the autobody use of the present methods and products, a composition of a light cure resin and a thermosetting resin, arranged in an interpenetrating network, is impregnated into a fiber reinforcement, such as a fiberglass mat to form a structure. The thermosetting resin is cured sufficiently to hold the light cure resin in place in the mat structure. The mat structure, sometimes referred to herein as a prepreg, slightly inwardly recessed, is used to bridge across the front side of an opening circumscribing the damaged area of the autobody component, e.g a reinforced resin bumper, body panel, etc. The mat structure is exposed to light adequate to cure the light cure resin, stiffening the mat structure and bonding the mat structure to the opening edge margin. Body filler is superimposed on the bridging mat structure and the mass finished for painting. Unlike any such autobody component repair previously used, this repair with the compositions and structures of the present invention is accomplished on the outside of the autobody component panel, avoiding removal and/or destruction of the existing body component panel, lessening cost and maximizing results for the car owner.

In a second highly commercial application, and one which demonstrates the versatility of the invention compositions and structures, an electronic assembly, i.e. the combination of conductive elements, is effected with benefits in dimensional stability, by impregnating a mat as before, and curing the light cure resin first to retain in place the uncured thermosetting resin (the reverse of the previously described procedure), to obtain a somewhat stiffened, easy to handle, lightly tacky structure. This structure can be cut to fit the footprint of an electronic element to be bonded to another electronic element, e.g. a circuit board. The assembly is made with the mat sandwiched between the electronic components and the thermosetting resin is then cured bonding the elements together. The strength and precision of the structure and the fixed dimensionality of the mat is of benefit in avoiding stresses in the assembly in subsequent thermal cycling situations.

These and other applications of the invention are benefitted by the invention composition comprising an interpenetrating network of resins, separately curable, and under widely different conditions, acting to restrain one another for convenience and neatness of use, dependent on the sequence of resin cure.

BACKGROUND

Interpenetrating network resin compositions are known. In one form these compositions have a first resin commingled with a second resin, each broadly maintaining its individual properties, such that the resultant of the blend is a combination of physical properties not afforded by either resin individually.

SUMMARY OF THE INVENTION

It is an object of the invention to provide new applications of interpenetrating network resin compositions, ones in which one resin possibly mechanically, blocks unwanted flow from a fiber reinforcement of the other resin, and new interpenetrating network compositions of a first and second resin in which the first resin is a light cure resin, i.e. a resin which through the presence of suitably reactive and suitably numerous reaction sites on the resin molecules and the presence as needed of catalytic agents will react into high molecular weight polymer upon exposure to light. The second resin is a thermosetting resin. In the invention systems the interpenetrating network uniquely functions to support the thermosetting resin in place for cure by an initial cure of the light cure resin, and the thermosetting resin uniquely supports the light cure resin in place for cure, depending on the sequence of cure of the respective resins.

It is a specific object to provide for autobody component repair in accordance with the invention in which a pre-preg of a fiber reinforcement impregnated with an interpenetrating network of light cure resin and thermosetting resin is placed and shaped with the thermosetting resin cured, the light cure resin is then cured in a matter of seconds or minutes, depending on composition and/or light energy applied, and serves to hold the pre-preg in place and in shape for addition of body filler and finishing operations. It is another specific object to provide for electronic assembly manufacture in accordance with the invention in which a pre-preg of a fiber reinforcement impregnated with an interpenetrating network of light cure resin and thermosetting resin is interposed between opposed electronic components with the light cure resin cured, the thermosetting resin is then cured in a matter of seconds or minutes, depending on composition and/or thermal energy applied, and serves to bond the components together.

It is a further object to provide an invention which is broadly applicable to formation of end-use or intermediate structures of highly variable form in which the convenience and speed of light cure is desirable, but in which the properties of conventional thermosetting resins is likewise desirable, in a sequence of light cure first and thermosetting resin cure second, or vice-versa, to methods of repair and molding in which these characteristics of flexibility of result, speed and permanence are valued.

These and other objects of the invention to become apparent hereinafter are realized in accordance with the invention in the composition comprising an interpenetrating network of first and second resins, the first resin comprising a light curable resin, the second resin comprising a thermosetting resin.

The invention further includes the foregoing composition in combination with reinforcing fiber, and/or a filler, preferably a filler which is light transmitting sufficiently to permit cure of the light curable resin. Typically, the light cure resin and the thermosetting resin are each present in amounts from 5 to 95 parts by weight per 100 parts by weight of said composition, in general the amount of each resin used is such as will afford the short term or long term strength required in the application at hand, and/or block flow of the uncured resin when one resin is first cured and it is desired to control flow of the other resin until cure can be effected in the application.

Typical invention compositions will be combined with from 10 to 500 parts by weight of reinforcing fiber per 100 parts by weight of said composition, and/or from 5 to 500 parts by weight of filler per 100 parts by weight of said composition.

In preferred modes, the composition is in combination with a reinforcing fiber, and the first and second resins are each impregnated into the reinforcing fiber, and one of the first and second resins is flowable, and the other of the first and second resins is at least of a molecular weight or sufficiently cured to be nonflowable and to retain the one resin against flowing out from the reinforcing fiber. In this and like embodiments the one flowable resin is the light curable resin, and said other nonflowable resin is the thermosetting resin, or the one flowable resin is the thermosetting resin, and the other, nonflowable resin is the light curable resin.

In the mentioned compositions, preferably, the light curable resin comprises an ethylenically reactive vinyl- or allyl-moiety containing monomer, oligomer or polymer, and more particularly, the light curable resin comprises repeating units of acrylate, fumarate, maleate, unsaturated polyester resin, vinyl pyrollidone, vinyl pyridine, and/or butadiene moieties, or repeating units of allyl alcohol and/or allyl alcohol ester moieties. The thermosetting resin preferably comprises repeating urethane, epoxy, siloxane, phenolic and/or melamine linkages, and more preferably repeating urethane linkages, particularly where the light curable resin comprises repeating acrylate moieties.

In certain preferred modes of the invention the mixed resin composition is employed in combination with fiber reinforcement. The fiber reinforcement preferably comprises a fiberglass web, the fiberglass web being at least locally impregnated with said light curable and thermosetting resins. In this and like embodiment, there is further included a particulate filler, especially talc which does not inhibit light cure of the light curable resin.

As noted, a particular advantage of the present invention is the ability to have an uncured resin, albeit liquid, retained on the fiber reinforcement as though a viscous material by first curing one or the other of the resins, so as to support, as if occluding, the other resin, e.g. light curable acrylic or acrylate resin is cured sufficiently to be nonflowing on said fiberglass web and retain uncured said thermosetting urethane resin from flowing from said fiberglass web.

In certain of such combinations, the light curable acrylate resin in its cured condition is sufficiently stiff to hold the fiberglass web in a predetermined configuration with the uncured urethane thermosetting resin distributed through the fiberglass web for subsequent cure.

Further in such combinations, the light curable acrylate resin in its cured condition comprises elongate strands threaded through said thermosetting urethane resin impregnated in said fiberglass web in retaining relation against thermosetting urethane resin flow from said fiberglass web.

Broadly, in the combination of the invention composition and fiber reinforcement, the thermosetting urethane resin is cured in an interpenetrating network relation with said light curable acrylate resin on and through said fiberglass web. Accordingly the invention provides in combination a fiber reinforcement and a composition comprising a light curable resin cured into elongate strands extending through a thermosetting resin impregnated into said fiber reinforcement in retaining relation against thermosetting resin flow from the fiber reinforcement.

In certain other embodiments, the thermosetting urethane resin is sufficiently cured to be nonflowing on the fiberglass web and retain uncured the light curable acrylate resin from flowing from the fiberglass web. In such embodiments, typically, the thermosetting urethane resin in its cured condition is sufficiently stiff to hold the fiberglass web in a predetermined configuration with the uncured acrylate light curable resin distributed through said fiberglass web for subsequent cure. Further, the thermosetting resin in its cured condition comprises elongate strands threaded through the light curable acrylic or acrylate resin impregnated in said fiberglass web in retaining relation against light curable acrylic or acrylate resin flow from the fiberglass web.

Broadly, the thermosetting urethane resin is cured in an interpenetrating network relation with the light curable acrylate resin on and through said fiberglass web.

Accordingly, the invention provides in combination a fiber reinforcement and a composition comprising a thermosetting resin curable into elongate strands extending through a light curable resin impregnated into a fiber reinforcement in retaining relation against light curable resin flow from the fiber reinforcement.

With particular reference to the mechanical arrangement of the resins, the invention provides a composition as just described in which the light curable resin is intimately commingled with the thermosetting resin and so commingled is separately curable therefrom under light energy having no curing effect on the thermosetting resin.

In this and like embodiments, typically, the light curable resin comprises repeating acrylic or acrylate units and the thermosetting resin comprises repeating urethane linkages, the composition is usefully combined with a fiber reinforcement, e.g. a fiber reinforcement comprising fibers of glass, carbon, metal, synthetic organic polymer, cellulosic or protein material.

The fibers are advantageously arranged in a web, i.e. an elongated, or square or wide, generally flat, or round, or tubular array, such as a web that forms or defines a fabric of woven or non-woven fibers. The fiber reinforcement may comprise fabrics of different fibers, e.g. a fiber reinforcement of fabrics which include glass cloth and synthetic organic polymer cloth.

In a specific embodiment the invention comprises the structure comprising a resin composition and a fiber reinforcement arranged in a predetermined configuration, the composition comprising an interpenetrating network of first and second resins, the first resin comprising a light curable resin, the second resin comprising a thermosetting resin. The composition may further comprise a filler, particularly a filler which is light transmitting sufficiently to permit cure of said light curable resin.

In such embodiments, typically the light curable resin and the thermosetting resin are each present in amounts from 5 to 95 parts by weight per 100 parts by weight of the composition, and/or the reinforcing fiber is present in an amount from 10 to 500 parts by weight per 100 parts by weight of the composition, and/or there is further present from 5 to 500 parts by weight of filler per 100 parts by weight of said composition, one of the light curable resin and the thermosetting resin is cured and the other uncured, the cured resin being distributed through the uncured resin in a manner to block flow of the uncured resin from the structure, e.g. the light curable resin is the cured resin and the thermosetting resin the uncured resin.

The just described structure is useful in electronic assembly applications, e.g. the structure is adhered between opposed substrates blocking light access to the structure, whereby said structure is bondable to either or both of the substrates by cure of the thermosetting resin freely of further cure of the light curable resin.

Alternatively, the light curable resin is the uncured resin and the thermosetting resin is the cured resin, e.g. the structure is adhered to a substrate with the thermosetting resin and at least partially light exposed, whereby said light curable resin is light curable in the substrate adhered condition of the structure.

In the embodiments discussed and others, typically, the thermosetting resin comprises repeating urethane, epoxy, siloxane, phenolic and/or melamine linkages.

In a further aspect of the invention, there is provided a two-stage pre-preg structure comprising a fiber reinforcement impregnated with an interpenetrating network of a light cure resin and a thermosetting resin which are independently curable. Typically, in this pre-preg structure, the fiber reinforcement comprises fibers of glass, carbon, metal, synthetic organic polymer, cellulosic or protein material, the light curable resin comprises repeating units of acrylate, fumarate, maleate, unsaturated polyester resin, vinyl pyrollidone, vinyl pyridine, allyl alcohol, allyl alcohol ester, and/or butadiene moieties, and the thermosetting resin comprises repeating urethane, epoxy, siloxane, phenolic and/or melamine linkages.

In accordance with the invention, then, in the two-stage pre-preg structure in which one of the light curable and thermosetting resins is initially cured, the initially cured resin is distributively present in amounts holding the second of the resins in place on the fiber reinforcement for subsequent curable. The initially cured resin may be the light curable resin or the thermosetting resin.

The invention further contemplates the provision of the pre-preg structure and a substrate. In this connection in another aspect of the invention, there is provided a method of building a multilayer element including laminating a substrate with the pre-preg structure, typically including arranging the pre-preg structure in which the initially cured resin is cured against the surface portion of the substrate where lamination is to take place, and curing the subsequently cured resin.

In yet another aspect, previously alluded to, the invention provides a method of repair of a damaged vehicle body component, including removing the damaged area, closing the resulting opening by extending thereacross a pre-preg structure configured to form a slight recess, the pre-preg structure comprising a light curable resin, a thermosetting resin and a fiber reinforcement, the thermosetting resin being cured sufficiently to support the light curable resin on the fiber reinforcement against flowing off the structure and sufficiently to render the structure sufficiently tacky to adhere to the body component around the opening, exposing the structure to light and after cure of the light curable resin filling the structure recess with body filler, and finishing the repair by smoothing the filler material.

In the aforementioned method, there may further be included shallowly chamfering the edge margin of the damaged area opening, and blending the edges of the pre-preg structure with the chamfered opening after cure of the light curable resin and before addition of body filler for a smooth transition between the opening edge margin and the pre-preg structure.

Accordingly, the invention provides in this aspect, a repaired autobody component comprising an autobody component having an opening circumscribing a damaged area, a pre-preg structure extended across said opening and slightly recessed, the pre-preg comprising a light curable resin, a thermosetting resin pre-cured to support the light curable resin on the fiber reinforcement, body filler supported on the pre-preg subsequent to light cure of the light curable resin, the pre-preg structure and filler being blended into the autobody component.

In a second major aspect, the invention provides a method of fabricating electronic assemblies including juxtaposing first and second components of an electronic assembly to be bonded together, interposing between said components a cut-to-fit pre-preg structure comprising a fiber reinforcement impregnated with an interpenetrating network of a light curable resin and a thermosetting resin which are independently curable, the light curable resin being cured to retain the uncured thermosetting resin against flowing from the fiber reinforcement, and curing the thermosetting resin in situ between the components in component co-bonding relation.

In this aspect of the invention, then there is provided an electronic assembly comprising first and second electronic components, and interposed between the components in bonding relation a cut-to-fit pre-preg structure comprising a fiber reinforcement impregnated with an interpenetrating network of a light curable resin and a separately cured thermosetting resin.

In still another aspect, the invention provides the method of molding moldable material into a desired shape, including out of light conforming a fiber reinforced composition of uncurable light curable resin into a mold form having the reverse of the desired shape, curing the light curable resin to maintain the reverse shape, and thereafter molding the moldable material on the fiber reinforced composition in the desired shape.

In accordance with this method, there is also included incorporating a thermosetting resin into the light curable resin in an interpenetrating network in the fiber reinforced composition, and curing the thermosetting resin to retain the light curable resin from flowing from the fiber reinforcement, thereupon molding the moldable material into the desired shape and thereafter curing the light curable resin.

In another aspect, the invention provides for achieving the mentioned interpenetrating network of resins, disposed as elongated strands, the method of forming an interpenetrating network of separately curable light curable resin and thermosetting resin including simultaneously driving each resin from separate containers through a common mixing zone having a series of baffles that alternately mix and divide the resins, and expressing the resins from the zone as intertwined elongated strands. More particularly, the method includes also driving the light curable and thermosetting resins reagents toward the common mixing zone, separately, to the common mixing zone, and commingling the respective reagents to form the resins within the zone. In this last as in previous methods, there is further included impregnating a fiber reinforcement with the expressed resins.

The method of impregnating a fiber reinforcement with an interpenetrating network of at least two resins, according to this embodiment of the invention, includes separately simultaneously driving the resin reagents from respective containers through a common mixing zone which intimately commingles the reagents and expresses them from the zone in a pattern of elongated strands, depositing the expressed strands onto a fiber reinforcement, and impregnating the fiber reinforcement therewith.

This method further contemplates selecting a light curable resin as one resin and a thermosetting resin as a second resin, first combining certain of the light curable resin reagents with certain of the thermosetting resin reagents and the balance of the light cure resin reagents with the balance of the thermosetting resin reagents, and thereafter combining both sets of reagents in the common mixing zone to form the respective resins for expression from the zone.

In the just noted method, too, there is included, the resins being fluid, sequentially reacting the resins to higher molecular weight so as to render the first reacted resin insufficiently fluid to flow from the fiber reinforcement, and blocking flow out of the fiber reinforcement of the second-to-be-reacted resin with the first reacted resin.

The invention is illustrated by the following Examples in which all parts are by weight.

EXAMPLE 1

Preparation Of The Light Curable Resin: The following were weighed into a vessel: 40.0 parts of bisphenoldigylcidylether dimethacrylate (dimethacrylate ester of 400 molecular weight polyethyleneglycol); 2.5 parts of diethylaminoethylacrylate and 0.2 parts of camphorquinone and 10 parts of flame retardant Antiblaze 100 (Albright and Wilson). The resin base was thoroughly mixed under low intensity red light at 25 degrees F. Ten parts of particulate filler comprising fumed silica were added and thoroughly blended into the mixture. Then 7.5 parts of a second particulate filler comprising talc were added and thoroughly blended into the mixture. The mixture was degassed to 10 millimeters of mercury and then packaged in sealed cartridges.

Preparation Of The Pre-Preg Structure: A pre-preg structure was prepared by impregnating a 4" by 10" multilayered layered strip consisting of top layer comprising adhesive nylon mesh of 4 mil thickness, a first intermediate layer comprising fiberglass mat of 16 mil thickness, a second intermediate layer comprising adhesive nylon mesh of 4 mil thickness and a bottom layer comprising fiberglass mat of 16 mil thickness. Thirty-five grams of the light curable resin prepared above was applied from the cartridge uniformly across the strip upper surface. Oversize layers of polyethylene release film were used to protect the top and bottom surfaces of the strip. The resin bearing multilayer strip was then placed between squeeze rollers and the resin was thoroughly incorporated into the several layers, and thusly impregnated into all the interstices of the nylon mesh and glass mat. The resultant impregnated multilayer assembly defines a typical pre-preg structure according to the invention. The pre-preg structure was then placed in a non-light-transmitting plastic (or metal foil) pouch to keep the light cure resin stable and uncured.

Preparation Of The Laminate With Pre-Preg Structure: The just prepared pre-preg structure can be readily shaped or simply formed into diverse configurations, suitably after lamination to another material. For example, a highly useful laminate is prepared by pressing the pre-preg structure against a fiberglass web, possibly containing a thermosetting resin impregnant, e.g. using a roller. In practice, it has been found that such a laminate will remain uncured for hours, allowing a great amount of working time so as to precisely shape the laminate, even in indirect sun, or fluorescent or incandescent light at levels experienced in shop areas. Upon being exposed to direct sunlight, however, the pre-preg structure bonds and curables to the fiberglass web, forming a rigid structure after 5 minutes.

EXAMPLE 2

Preparation Of The Light Curable Resin Reagent Mixtures I And Thermosetting Resin: 19.5 parts of a liquified monomer of diphenylmethane diisocyanate (Mobay Chemical Mondur CD), was combined in a suitable vessel with 5.5 parts of water-free castor oil, 74.7 parts of the dimethacrylate ester of 400 molecular weight polyethyleneglycol and 0.3 parts of camphorquinone. The mixture was heated to 160 F. for 1 hour under nitrogen. The product was a light curable resin with the thermosetting urethane precursor resin therein. An aliquot portion of the resin was packaged under dry nitrogen.

Preparation Of The Light Cure Resin Reagent Mixture II and Thermosetting Resin: 16 parts of a 6000 m.w. polyoxypropylene ether polyol triol, 5.2 parts of ethylenediaminetetrapropoxylate, 3 parts of m-xylenediamine, 0.25 parts of organo bismuth naphthenate, 47 parts of bisphenoldiglycidylether dimethacrylate, 10.2 parts of the dimethacrylate ester of 400 m.w. polyethylene glycol, 5 parts of diethylaminoethylacrylate and 12 parts of Antiblaze 100 (Albright and Wilson). The mixture was heated to 220 F. and degassed at 10 mm of Hg pressure and packaged.

Preparation Of The Pre-Preg: The Reagent Mixtures I and II and III were dispensed onto a mat/mesh assembly like that described in Example 1 from cartridges loaded with the respective resin reagent mixtures, and coupled to a common static mixer having a baffle system which alternately divides and blends the resin reagents in an intimate mixing manner, achieving an intimate blend in which the resins reagents are commingled and striated into elongated strands which twist and turn through one another, effecting the interpenetrating network. The resulting resins were squeeze rolled into the mat/mesh assembly as in Example 1. The thermosetting resin was cured leaving the light curable resin uncurable. The light curable resin did not flow from the fiber reinforcement of the mat/mesh combination. The resultant pre-preg was placed in a black pouch for protection against light and premature curable of the pre-preg/light curable resin.

Preparation Of The B-Stage Laminate: The foregoing pre-preg was laminated to a rigid fiberglass and resin panel, simulative of a surfboard, by removing the pre-preg from the protective black pouch, separating the lower polyethylene release film, which left nearly all the resins in place and laying the pre-preg, exposed resin side down onto the panel and in full contact therewith. The laminate was placed in direct sunlight. Within 5 minutes, the laminate cured, bonded and formed a rigid reinforcement against the fiberglass panel by the cure of the light cure resin. It is characteristic of the inventions structures in this aspect that the pre-preg can be formed and bonded in place using only the light cure resin, the thermosetting resin having been earlier cured.

Alternatively, the invention affords quick conversion of the pre-preg into a immovable form or configuration, to be permanently converted upon final cure of the thermosetting resin, by cure of the light cure resin, and thereafter cure of the thermosetting resin.

EXAMPLE 3

Modification Of Light Curable Resin For Low Light Cure: There was added to Example 2, Side B, 100 parts, 0.5 parts of titanocene catalyst comprising Bis($N^5$-2,4-cyclopentadien-1-yl), Bis(2,6-difluoro-3-(1H-pyrrol-1-yl)phenyl) titanium, available from Ciba Geigy under the trade name CGI (Irgacure) 784, and the mixture blended thoroughly. The laminating steps of Example 2 were repeated but instead of direct sunlight the indoor fluorescent light was used. The result was the same, a structural laminate.

EXAMPLE 4

Preparation Of The Light Curable Resin Reagent Mixture I And Thermosetting Resin: 20.4 parts of dicyclohexane diisocyanate and 29.6 parts of a 6000 m.w. polyoxypropylene ether polyol triol were mixed in a reaction vessel. The mixture was heated to 320 F. for 30 minutes and then cooled to 200 F. A fifty gram quantity of the dimethacrylate ester of 400 molecular weight polyethylene glycol was added to the prepolymer along with 0.2 parts of camphorquinone. The mixture was maintained at 200 F. and vacuumed at 10 millimeters of pressure, cooled to room temperature and packaged under vacuum.

Preparation Of The Light Cure Resin Reagent Mixtures II And Thermosetting Resin: 39 parts of a 6000 m.w. polyoxypropylene ether triol polyol, 10 parts of ethylenediamine tetrapropoxylate, 1 part of bismuth napthenate, 33.3 parts of bisphenoldiglycidylether dimethacrylate, 3.4 parts of diethylaminoethylacrylate, and 8.3 parts of a fire retardant (Antiblaze 100 from Albright and Wilson) was mixed in a second reaction vessel. The mixture was heated to 220 F. and vacuumed at 10 millimeters of Hg.

Preparation Of The Pre-Preg-B-Stage: The I and II mixtures were mixed thoroughly and placed in respective cartridges. The combined mixtures were dispensed from the cartridges onto the a mat/mesh assembly as in Example 1 and protected by release film was squeezed between two rollers to create uniform distribution of the resin in the pre-preg. The pre-preg was then shaped and light-curable under sunlight. The result was a shaped matrix which contained, supported against flow from the reinforcement, the unreacted urethane thermosetting materials.

Pre-Preg Reaction To C-Stage. The shaped matrix just prepared was cured to its final cure point (C-Stage) by placing the matrix in the oven at 200 F. for 24 hours.

The foregoing composition can be filled with up to 25 parts by weight of a particulate filler such as talc with like results, at a lower cost.

EXAMPLE 5

Laminate Adhesive In Circuit Board Production: A pre-preg is prepared as in Example 4, but before the final cure the matrix is die-cut to a shape useful in bonding heat sinks to printed circuit boards. The light cure resin is reacted under appropriate light. The cured light cure resin bonded pre-preg is bonded to the fiber-reinforced polymer circuit board substrate by then curing the thermosetting resin in contact with the substrate. After positioning the heat sink element atop the circuit board substrate the thermosetting resin is cured, permanently bonding the heat sink element to the board. The matrix proves uniquely advantageous in reducing warpage in thermal stress situations below that of other laminate adhesives.

EXAMPLE 6

Auto body components are repairable more easily and quickly with the pre-preg structures of the present invention. In a typical repair of an autobody component, the damaged area is cut away, backing is placed across the rear face of the cut away area for supporting the putty like repair material. Before this invention, the support backing had to be installed behind the cut away area, a difficult proposition given the size of the cut away area and the awkwardness of reaching into recondite locations.

While the pre-preg structures of this invention can be used in the old style of repair, and with advantages in that the pre-preg structure is flexible for insertion and can then be rigidified by simple light exposure, to support the repair paste, the uniquely responsive properties of the invention structures open new avenues of repair which are highly advantageous.

Thus, in accordance with the invention, the damaged area is cut-away as before, but the opening edges are chamfered at a substantial angle, e.g. 45 degrees or more, to suitably provide an inch of slope in a ¼ inch thick panel. Rather than putting the support structure behind the opening, in this aspect of the invention the pre-preg structure, thermosetting resin-cured to hold the uncured light cure resin in place and to give the pre-preg a clean handling feel, is fitted to the opening, using the chamfering to keep the pre-preg from extending above the plane of the component surface. The pre-preg structure is then light cured, as by moving the vehicle outside into the sunshine, bonding the pre-preg in place. The pre-preg structure can be bellied back to accommodate the repair paste and repair proceeds as with other repair schemes.

It will be evident from the foregoing Examples that the invention broadly provides a composition comprising in a preferred embodiment an interpenetrating network of first and second resins, the first resin comprising a light cure resin and the second resin comprising a thermosetting resin, reinforcing fiber and a filler. The relative proportions of these resins is not narrowly critical with each resin being suitably present in weight amounts from 5 to 95 parts per 100 parts of the resin content of the composition. Obviously the specific properties of the composition will vary with the relative amounts of each resin. The term light cure resin herein refers to a resin which will crosslink or cure under visible or invisible light with or without the added presence of a catalyst. In general, the light cure is rapidly effected as an advantage of the invention. Light cure polymers are widely known, in the dental field for example.

Thermosetting resins are those which crosslink or cure in response to thermal energy including elevated or ambient thermal energy as well as specific heat ranges peculiar to given resins. Typically, the curing reaction in these polymers is an addition reaction. The thermosetting resins are generally immune to cure under light and this enables a two-step curable cycle with the light cure being effected without cure of the thermal cure resin as shown above.

Specific chemical systems useful as the light cure resin include resins comprising an ethylenically reactive vinyl- or allyl-moiety containing monomer, oligomer or polymer, such as and typically those resins which comprise repeating units of acrylic or acrylate, fumarate, maleate, unsaturated polyester resin, vinyl pyrollidone, vinyl pyridine, and/or butadiene moieties, or repeating units of allyl alcohol and/or allyl alcohol ester moieties.

Specific chemical systems useful as the thermosetting resin include resins comprising repeating urethane, epoxy, siloxane, phenolic and/or melamine linkages.

The reinforcing fiber content of the invention compositions and structures will generally range between 10 to 500 parts by weight of reinforcing fiber per 100 parts by weight of the resin composition. Suitable reinforcement, as earlier noted, includes fiber reinforcement that comprises fibers of glass, carbon, metal, synthetic organic polymer, e.g. aramide fibers, cellulosic, e.g. rayon and wood fibers, or protein material such as wool.

While the reinforcing fibers can be randomly distributed and of the same or different lengths, arranged paraxial or transversely, or both, it is preferred for ease of handling that the fibers be arranged in a web. The fiber web may be a fabric of woven or non-woven fibers, and layers of different fabrics of fibers can be used as previously set forth.

The objects of the invention are thus met, including provision of new applications of interpenetrating network resin compositions, ones in which one resin possibly mechanically, blocks unwanted flow from a fiber reinforcement of the other resin, and new interpenetrating network compositions of a first and second resin in which the first resin is a light cure resin, i.e. a resin which through the presence of suitably reactive and suitably numerous reaction sites on the resin molecules and the presence as needed of catalytic agents will react into high molecular weight polymer upon exposure to light. The second resin is a thermosetting resin. Also provided is an autobody component repair in which a pre-preg of a fiber reinforcement impregnated with an interpenetrating network of light cure resin and thermosetting resin is placed and shaped with the thermosetting resin cured, the light cure resin is then cured in a matter of seconds or minutes, depending on composition and/or light energy applied, and serves to hold the pre-preg in place and in shape for addition of body filler and finishing operations. Also provided is a method of electronic assembly manufacture in accordance with the invention in which a pre-preg of a fiber reinforcement impregnated with an interpenetrating network of light cure resin and thermosetting resin is interposed between opposed electronic components with the light cure resin cured, the thermosetting resin is then cured in a matter of seconds or minutes, depending on composition and/or thermal energy applied, and serves to bond the components together. In addition, there are provided method and means of formation of end-use or intermediate structures of highly variable form in which the convenience and speed of light cure is desirable, but in which the properties of conventional thermosetting resins is likewise desirable, in a sequence of light cure first and thermosetting resin cure second, or vice-versa, to methods of repair and molding in which these characteristics of flexibility of result, speed and permanence are valued.

We claim:

1. Composition for interpenetrating network comprising a first reagent and a second reagent, said first reagent comprising a light curable resin of an ethylenically reactive vinyl-, or allyl-moiety containing monomer mixed with urethane polymer formers comprising diphenyl methane diisocyanate or dicyclohexane diisocyanate; said second reagent comprising a light curable resin of an ethylenically reactive vinyl-, or allyl-moiety containing monomer, oligomer or polymer and a polyol forming a urethane polymer with said diisocyanates; in combination with a filler for said composition in at least one of said first and second reagents, said composition and said filler being further combined with fiber reinforcement and a catalyst for the light cure of said light curable resin under conditions under which said light curable resins are not reactive and remain flowable and said urethane polymer forming diisocyanates are reactive with said polyol to form urethane polymer which is sufficiently cured to be nonflowable and to retain said light curable resins in place against flowing from said reinforcing fiber.

2. Combination according to claim 1, in which said filler is light transmitting sufficiently to permit curable of said light curable resins.

3. Combination according to claim 1, in which said light curable resins and said urethane polymer reaction product of said diisocyanates and polyol are each present in amounts from 5 to 95 parts by weight per 100 parts by weight of said composition.

4. Combination according to claim 3, in which said filler is particulate and is present in an amount from 5 to 500 parts by weight of filler per 100 parts by weight of said composition.

5. Combination according to claim 3, in which said reinforcing fiber is present in an amount from 10 to 500 parts by weight per 100 parts by weight of said composition.

6. Combination according to claim 5, which said filler is particulate and is present in an amount from 5 to 500 parts by weight of filler per 100 parts by weight of said composition.

7. Combination according to claim 3, in which said light curable resins and urethane polymer are each reinforced said reinforcing fiber, said combination being flexibly formable until said light curable resin is cured.

8. Combination according to claim 1, in which said fiber reinforcement comprises fibers of glass, carbon, metal, synthetic organic polymer, cellulosic or protein material.

9. Combination according to claim 8, in which said light curable resin comprises repeating units of allyl and/or allyl alcohol ester moieties.

10. Combination according to claim 1, in which each said light curable resin comprises repeating units of acrylic or acrylate, fumarate, maleate, unsaturated polyester resin, vinyl pyrollidone, vinyl pyridine, and/or butadiene moieties.

11. Combination according to claim 1, in which said filler comprises talc or silica.

12. Combination according to claim 1, in which said fiber reinforcement comprises fibers of glass, metal, synthetic organic polymer, cellulosic or protein material arranged in a web.

13. Combination according to claim 12, in which said fiber reinforcement comprises fiberglass web.

14. Combination according to claim 13, in which said filler comprises talc or silica.

15. Combination according to claim 14, in which said fiber reinforcement comprises a fiberglass web.

16. Combination according to claim 1, light cure catalyst comprises a titanocene.

17. Combination according to claim 1, in which said light cure catalyst comprises Bis(N5-2,4-cyclopentadien-1-yl), Bis(2,6-difluoro-3-(1H-pyrrol-1-yl)phenyl)titanium.

* * * * *